(12) United States Patent
McQuilkin

(10) Patent No.: US 11,300,608 B2
(45) Date of Patent: Apr. 12, 2022

(54) SEGMENTED PIN DRIVER SYSTEM

(71) Applicant: Analog Devices, Inc., Norwood, MA (US)

(72) Inventor: Christopher C. McQuilkin, Hollis, NH (US)

(73) Assignee: Analog Devices, Inc., Norwood, MA (US)

( * ) Notice: Subject to any disclaimer, the term of this patent is extended or adjusted under 35 U.S.C. 154(b) by 30 days.

(21) Appl. No.: 15/074,533

(22) Filed: Mar. 18, 2016

(65) Prior Publication Data

US 2017/0269149 A1 Sep. 21, 2017

(51) Int. Cl.
*G01R 31/28* (2006.01)
*H03K 3/012* (2006.01)
*H03K 19/0175* (2006.01)

(52) U.S. Cl.
CPC ......... *G01R 31/2837* (2013.01); *H03K 3/012* (2013.01); *H03K 19/017509* (2013.01)

(58) Field of Classification Search
CPC ... H03K 19/017509; H03K 19/017518; H03K 19/017527; H03K 19/017536; H03K 3/012; H03K 3/013; H03K 19/018528; G01R 31/2837; G01R 31/2836
USPC ....................................................... 327/109
See application file for complete search history.

(56) References Cited

U.S. PATENT DOCUMENTS

| | | | |
|---|---|---|---|
| 5,842,155 A * | 11/1998 | Bryson | G01R 31/2844 324/73.1 |
| 5,955,890 A | 9/1999 | Gillette | |
| 6,292,010 B1 | 9/2001 | Persons et al. | |
| 6,737,857 B2 * | 5/2004 | Babcock | G01R 31/31926 324/762.02 |

(Continued)

FOREIGN PATENT DOCUMENTS

| | | |
|---|---|---|
| JP | S645175 U | 1/1989 |
| JP | 2010193338 A | 9/2010 |
| JP | 2015517787 A | 6/2015 |

OTHER PUBLICATIONS

"German Application Serial No. 10 2017 104 553.8, Office Action dated Jan. 15, 2020", w/o English Translation, 11 pgs.

(Continued)

*Primary Examiner* — Patrick C Chen
(74) *Attorney, Agent, or Firm* — Schwegman Lundberg & Woessner, P.A.

(57) ABSTRACT

In a test system that provides a high fidelity output signal, a transition driving circuit can selectively enable multiple, parallel current paths based on a desired voltage transition. The transition driving circuit can include a first switch configured to switch a first current path between an output node and a first current source/sink, and a second switch configured to switch a second current path between the output node and the first current source/sink. The transition driving circuit can include a control circuit that is configured to receive information about a desired voltage transition and, depending on a magnitude of the desired voltage transition, (Continued)

to selectively turn on one or both of the first and second switches to enable one or both of the first and second current paths to provide respective portions of the output signal from the first current source/sink to the output node of the test system.

6 Claims, 8 Drawing Sheets

(56) References Cited

U.S. PATENT DOCUMENTS

| | | | | |
|---|---|---|---|---|
| 7,405,592 B2* | 7/2008 | Ghobadian | ........ | H03K 19/0008 |
| | | | | 326/82 |
| 7,863,976 B1 | 1/2011 | Loeb | | |
| 8,536,944 B2 | 9/2013 | Spaeth | | |
| 8,901,972 B2* | 12/2014 | McQuilkin | ........ | H03K 19/0185 |
| | | | | 326/83 |
| 9,614,517 B2* | 4/2017 | Krishna | ............... | H03K 17/165 |
| 2002/0105350 A1* | 8/2002 | Babcock | .......... | G01R 31/31924 |
| | | | | 324/762.02 |
| 2009/0128182 A1* | 5/2009 | Kamo | .............. | G01R 31/31924 |
| | | | | 324/764.01 |
| 2009/0173641 A1 | 7/2009 | Brouwer et al. | | |
| 2011/0234317 A1* | 9/2011 | Arai | .................... | H03F 3/45183 |
| | | | | 330/253 |
| 2012/0153975 A1* | 6/2012 | Arai | ................... | G01R 31/2841 |
| | | | | 324/750.01 |
| 2013/0301326 A1* | 11/2013 | Zoels | ................. | H01L 27/0248 |
| | | | | 363/132 |
| 2014/0191783 A1 | 7/2014 | Moquilkin | | |

OTHER PUBLICATIONS

"Japanese Application Serial No. 2019-142285, Examiners Decision of Final Refusal dated Jan. 4, 2021", w/ English translation, 6 pgs.

"Japanese Application Serial No. 2019-142285, Notification of Reasons for Rejection dated Jun. 29, 2020", W/Engiish Translation, 6 pgs.

"Japanese Application Serial No. 2019-142285, Appeal filed May 6, 2021 to Examiners Decision of Final Refusal dated Jan. 4, 2021", w/ English claims, 26 pgs.

* cited by examiner

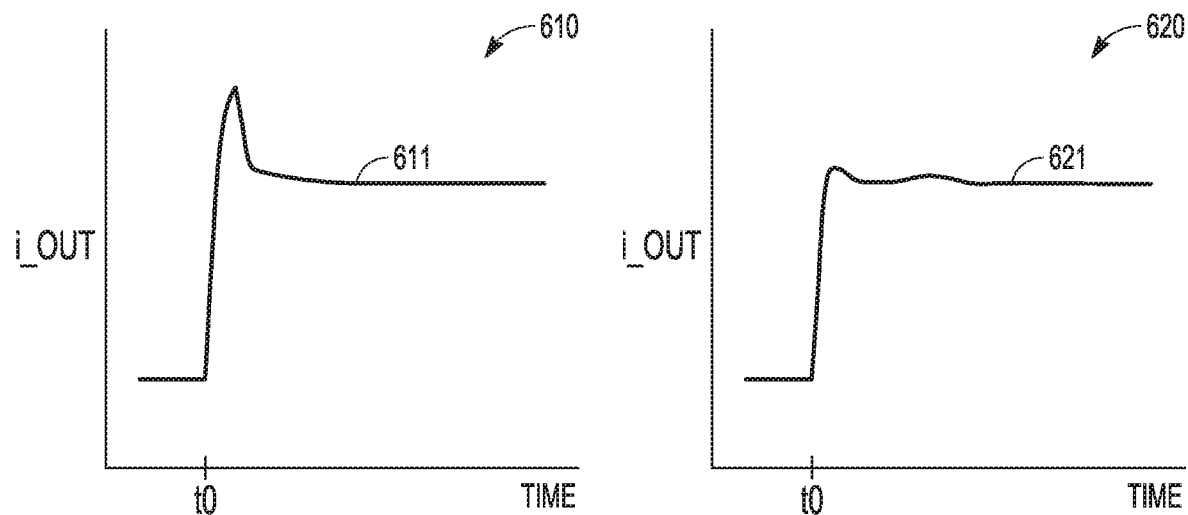
FIG. 6A
FIG. 6B
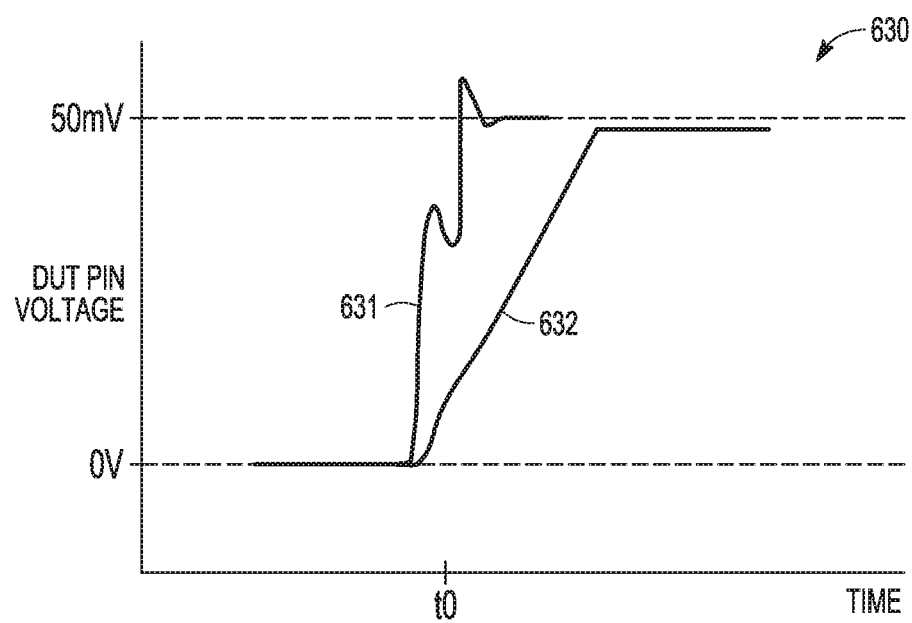
FIG. 6C

SEGMENTED PIN DRIVER SYSTEM

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters.

A test pulse provided by a pin driver circuit can have various characteristics, such as a specified frequency or amplitude, as can be required to test different electronic devices. For example, memory devices and very-large-scale integration (VLSI) devices can be tested differently. Memory devices can be tested using small amplitude (e.g., 25 mV to 500 mV), high frequency voltage swings. VLSI devices can be tested using large amplitude (e.g., greater than 500 mV), moderate speed voltage swings. Memory market requirements are traditionally addressed by pin driver circuits using "class A" techniques, and VLSI market requirements are traditionally addressed using "class AB" techniques.

Pin driver circuits can be qualified to perform various tests according to, among other things, a test pulse waveform fidelity (e.g., relative to some ideal waveform shape) or a test pulse timing precision. Spurious signals, such as transients that occur at or near test pulse transitions, can be produced and can impact a test system's output signal fidelity or timing. For example, an ideal voltage level transition can include a linear voltage transition between two voltage levels. An actual voltage level transition can include deviations such as overshoots, undershoots, pre-shoots, and slew nonlinearity, such as can be caused by spurious signals. Such deviations can negatively impact timing precision and test efficacy.

OVERVIEW

The present inventor has recognized, among other things, that a problem to be solved includes providing a test system that can provide high fidelity output signal pulses over a relatively large output signal magnitude range. For example, some devices under test have a pin that is used for test under both greater and lesser voltage swing ranges, such as using test signals generated from "class A" techniques and "class AB" techniques. The problem can include accommodating such a pin for test using a "class A" approach when a dynamic current test range (e.g., dictated by the DUT voltage swing range) is large and a physically large current switching stage is available to serve the pin. A large current switching stage generally enables large voltage swings but represents a liability when producing small voltage swings since spurious signals stemming from large parasitic capacitance associated with the switching stage can detract from the test voltage waveform fidelity.

In an example, a solution to the above-described problem includes minimizing parasitic effects associated with the switching stage. The solution can include using a switching stage that includes multiple parallel segments arranged in a switching network. Each of the multiple parallel segments can be selectively enabled to provide a portion of an output signal to a DUT output node. The switching network can have a characteristic capacitance that depends on the enabled ones of the parallel segments. For example, each segment can include a differential pair of transistors coupled between a current source and the DUT output node. Depending on a control signal indicative of a desired output swing, one or more of the differential pairs can be enabled, or switched, to carry a portion of the signal from the current source to the DUT output node. Each of the enabled segments can have a capacitance that contributes to the characteristic capacitance of the switching network. However, non-enabled segments can be effectively decoupled from the DUT output and thus capacitances associated with the non-enabled segments will not substantively contribute to a characteristic capacitance of the switching network.

In an example, a solution to the above-described problem further includes a method that includes monitoring a control signal input to determine a desired output signal characteristic at the DUT output node. The method can include enabling one or more segments in the switching network based on a first characteristic of the control signal. In response to a detected change from the first characteristic, the method can include using a lookup table to determine whether fewer or additional segments should be enabled to provide a desired output signal. The method can further include updating which one or more of the segments in the switching network are enabled or disabled to provide the desired output signal based on the control signal.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 6A-6C illustrate generally charts showing output signals corresponding to a class A driver circuit with a segmented switching circuit.

DETAILED DESCRIPTION

Figure 1:
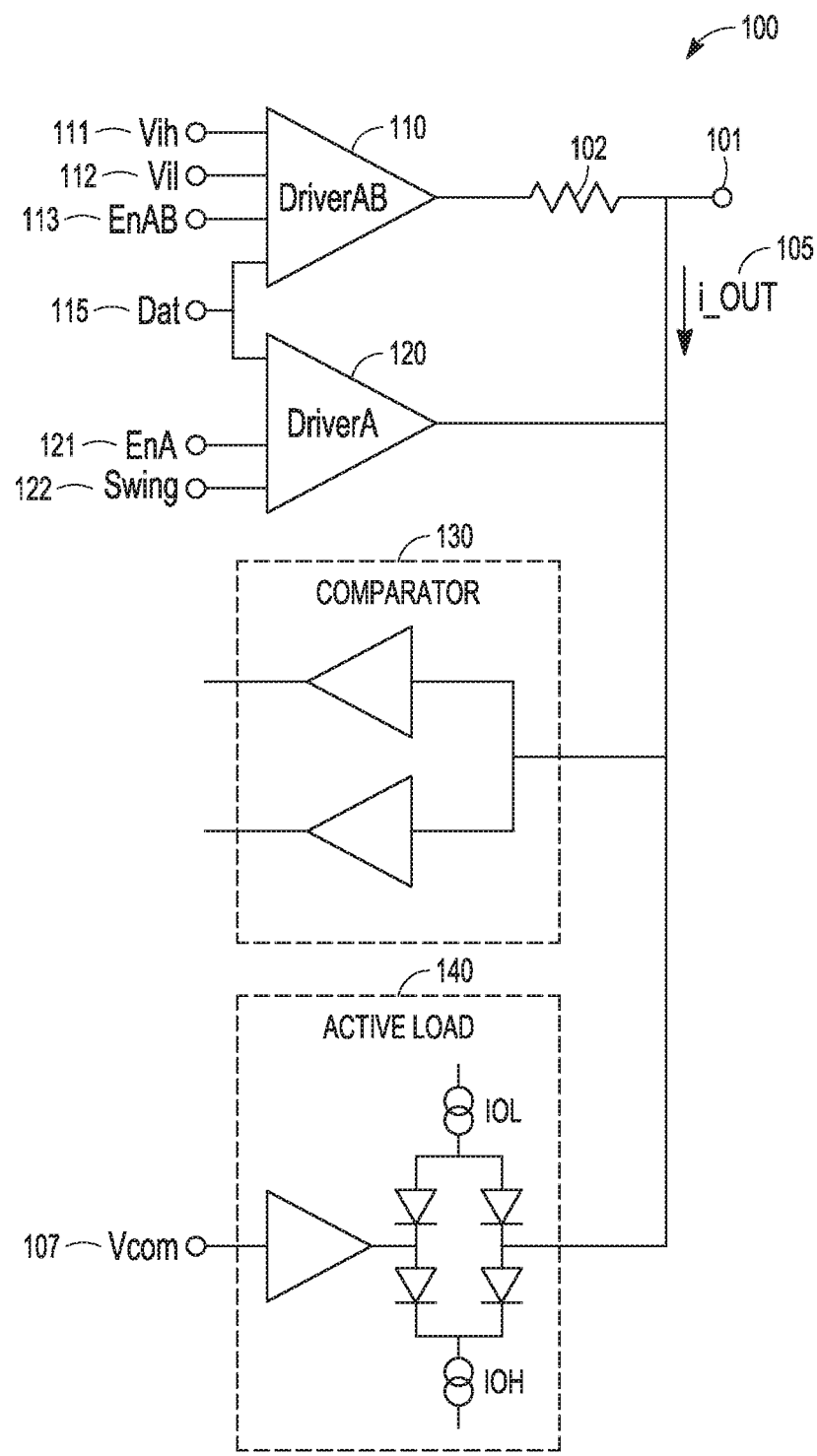
FIG. 1 illustrates generally an example of a test system topology including multiple driver circuits.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In an example, a pin driver circuit of a test system provides a voltage pulse stimulus to a device under test (DUT) at a specified time, and optionally measures a response from the DUT. The test system can be configured to provide high fidelity output signal pulses over a relatively large output signal magnitude range to accommodate different types of devices under test. In some examples, a test system includes a physically large current switching stage to facilitate large voltage swings. Such a large current switching stage, however, presents a liability for producing small voltage swings because spurious signals, such as due to a parasitic effects associated with a physically large switching stage, can detract from the test signal waveform fidelity.

The test systems and methods described herein provide, among other things, a switching stage with minimal parasitic effects at a test signal output node. In an example, the test systems described herein include multiple, selectively-enabled parallel switching segments that provide respective portions of an output signal to a DUT output node. The switching segments, or blocks, form a segmented switching circuit that has a characteristic capacitance that depends on the enabled ones of the parallel segments.

In an example, each switching block includes a differential pair of transistors coupled between a current source and a DUT output node. Depending on a control signal indicative of a desired output swing, one or more of the differential pairs can be enabled, or switched, to carry a portion of the signal from the current source to the DUT output node. Each of the enabled switching blocks can have a capacitance that contributes to a characteristic capacitance of the segmented switching circuit. However, non-enabled switching blocks can be effectively decoupled from the DUT output node and thus parasitics associated with non-enabled switching blocks do not contribute to a loading effect or characteristic capacitance of the segmented switching circuit. Various switching blocks can be dynamically enabled or disabled throughout a test procedure, for example, to minimize parasitic effects over a range of operating conditions.

FIG. 1 illustrates generally an example 100 of a test system topology including multiple driver circuits. The example 100 includes a class AB driver circuit 110, a class A driver circuit 120, a comparator circuit 130, an active load 140, and a DUT pin 101. The example 100 further includes an output element 102 configured to provide a specified output or load impedance. The test system provides an output current 105, i_OUT The comparator circuit 130, the active load 140, and the output element 102 can be configured to receive and interpret signals from the DUT.

In an example, the class AB driver circuit 110 is configured to produce a voltage stimulus signal by selecting between parallel connected diode bridges with each bridge driven by a unique, dedicated DC voltage level. In the example 100 of FIG. 1, DC voltages Vih 111 and Vil 112 drive diode bridges in the class AB driver circuit 110. The switching stage can be followed by a voltage buffering stage that can provide power gain, such as can be used to produce large currents to serve a 50 ohm DUT environment.

In contrast with the class AB driver stage, the class A driver circuit 120 is configured to produce voltage transitions at the DUT pin 101 using a relatively large current switch stage that is coupled directly to the DUT pin 101. The current switching stage in the class A driver circuit 120 alternately switches current into and out of the DUT pin 101 in response to a control signal Swing 122 (e.g., a voltage control signal). The class A driver circuit 120 can provide high speed operation since it isn't burdened by the class AB voltage buffering stage with its attendant bandwidth and other performance limitations.

In an example, the class A driver circuit 120 is configured to provide a relatively low amplitude signal at the DUT pin 101. For example, the class A driver circuit 120 can provide a signal having about a 2 volt swing. The class AB driver circuit 110 can be configured to provide a relatively high amplitude signal at the DUT pin 101, for example, −1.5 to +7 volts. The class A driver circuit 120 generally operates at a higher switching speed or bandwidth than the class AB driver circuit 110. In an example, the class AB driver circuit 110 is configured to absorb switching currents from the class A driver circuit 120. That is, the class AB driver circuit 110 can serve as a buffer that the class A driver circuit 120 can source current into, such as through the output element 102.

The class AB driver circuit 110 and the class A driver circuit 120 are selected to fulfill disparate DUT test requirements that may not otherwise be fulfilled by a single driver. For example, while both driver circuits can provide DUT waveforms, the class AB driver circuit 110 can be configured to provide large amplitude, low bandwidth stimulus signals, and the class A driver circuit 120 can be configured to provide low amplitude, high bandwidth stimulus signals.

In an example, the class AB driver circuit 110 and the class A driver circuit 120 do not share an enable pin. Instead, each driver circuit includes an independent enable control through pins EnAB 113 and EnA 121. The independent enable control facilitates the class AB driver circuit 110 to serve as a low speed, high voltage stimulus source, and to serve as a static, non-transitioning buffer to absorb switching currents from the class A driver circuit 120, as further described below in FIGS. 2A and 2B.

Figure 2A:
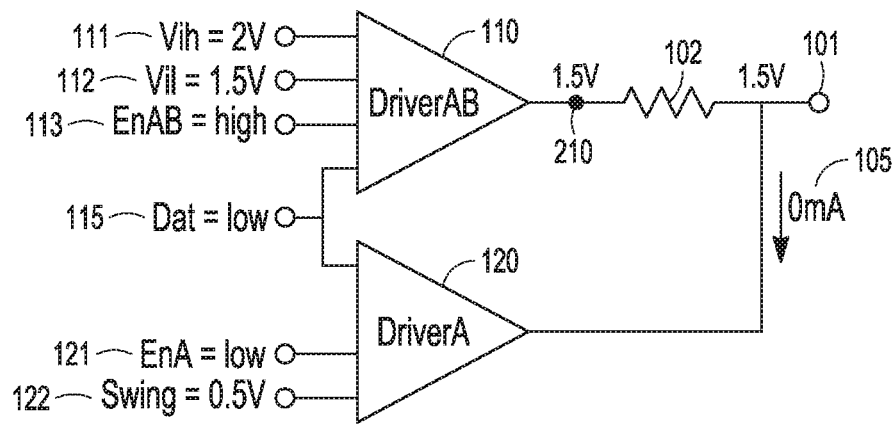
FIGS. 2A and 2B illustrate generally examples of different states of the driver circuits from FIG. 1.
Figure 2B:
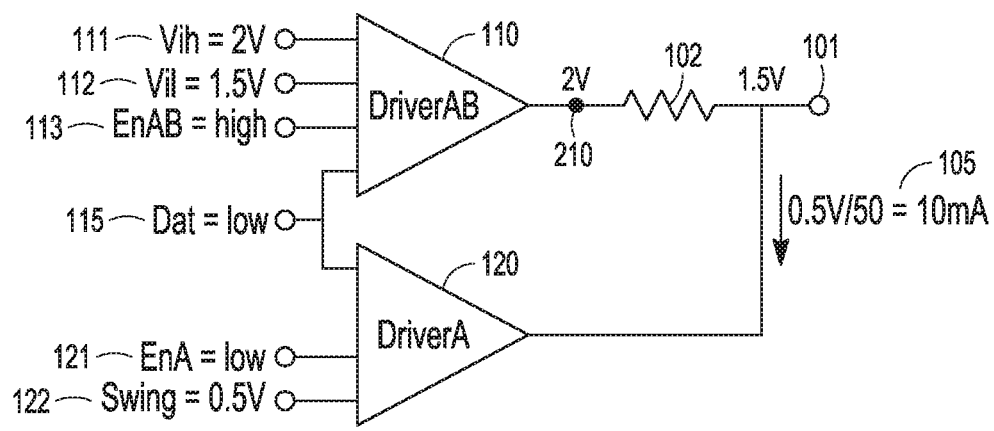

FIGS. 2A and 2B illustrate generally examples of different states of the driver circuits from FIG. 1. FIG. 2A illustrates the class AB driver circuit 110 enabled with the class A driver circuit 120 disabled. FIG. 2B illustrates the class AB driver circuit 110 disabled with the class A driver circuit 120 enabled.

In the example of FIG. 2A, the output current from the class A driver circuit 120 is 0 mA (i.e., i_OUT=0 mA). Thus no signal from the class A driver circuit 120 contributes to an output voltage at the DUT pin 101. Instead, the voltage at the DUT pin 101 is determined by the state of the enabled class AB driver circuit 110. In the example of FIG. 2A, the Dat 115 signal is low, and therefore Vil 112 is selected for output from the driver circuit. Because Vil has a voltage level of 1.5V, the same voltage level appears at a class AB output node 210 following the class AB driver circuit 110.

In the example of FIG. 2B, the class A driver circuit 120 is enabled. The output current from the class A driver circuit 120 is determined by a relationship between the Swing 122 voltage (0.5V) and a specified impedance value of the load (e.g., a 50 ohm DUT load). In the example of FIG. 2B, the class A driver circuit 120 provides i_OUT 105=0.5V/50 ohms=10 mA. Since EnAB 113 is in a low state, the class AB driver circuit 110 selects Vih 111 for output. Thus, 2V appears at the class AB output node 210. Since the voltage at the DUT pin 101 is a superposition of the voltage at the class AB output node 210 and the output current i_OUT, the voltage at the DUT pin 101 is 1.5V in this example, Thus, voltage signals at the DUT pin 101 are generated by the class A driver circuit 120 alternately switching current into or out of the DUT pin 101 while the class AB driver circuit 110 remains in a static state.

Figure 3A:
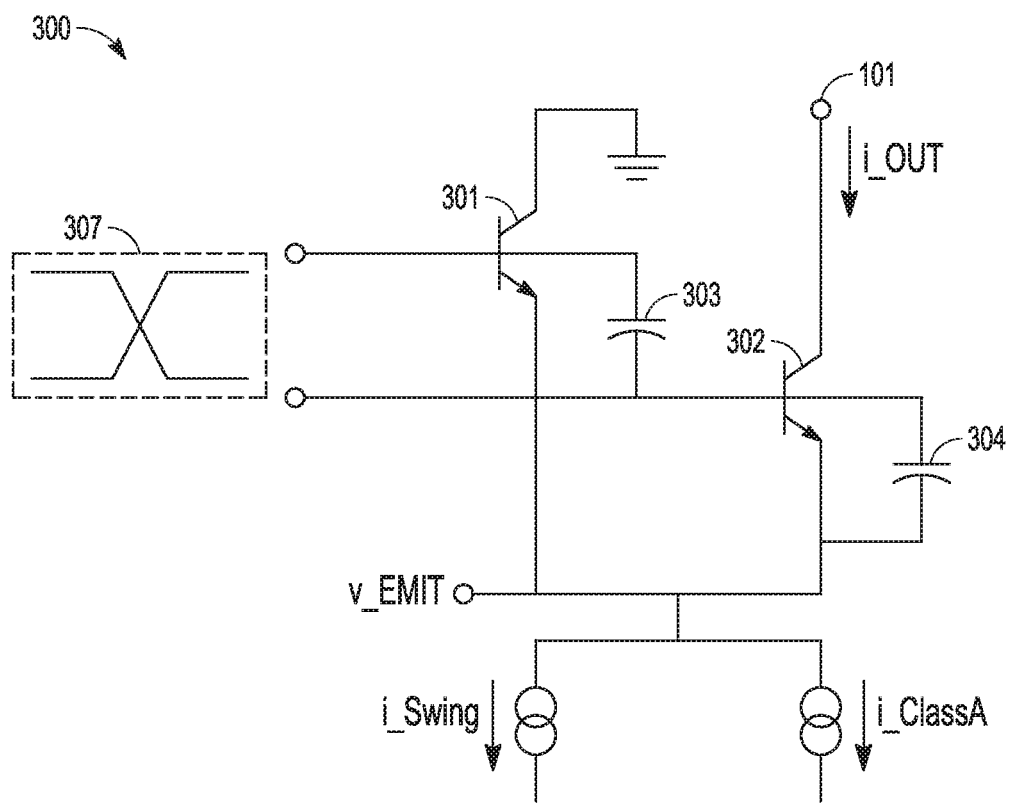
FIG. 3A illustrates generally an example of a class A switching stage.

FIG. 3A illustrates generally an example 300 of a class A switching stage. The example 300 includes a differential pair of transistors that switches current (e.g., i_OUT) into and out of the DUT pin 101. The differential pair includes a first switch 301 and a second switch 302. Each of the first and second switches 301 and 302 has a respective characteristic parasitic capacitance 303 and 304. The first and second switches 301 and 302 are configured to switch an output current signal based on voltage control signals 307, such as can be provided at the bases of the switches. In an example, the differential pair can be configured to switch a current signal i_Swing from GND to i_OUT to provide a DUT test signal at the DUT pin 101.

In an example, the physical size of the switching stage's differential pair can be selected based on a maximum anticipated switching current amplitude change. That is, test system switch sizes can be selected based on slew or current transition speed requirements in order to drive a DUT pin with a relatively large voltage amplitude swing in a small amount of time, the driver circuit can employ physically large switches to produce a relatively large amount of slew current, Large switch size, however, can correspond to large parasitic capacitance effects. Spurious signals that can result from the parasitic effects can be small relative to an overall large voltage swing range, however, spurious signals can be large when proportionally smaller swing signals are used. Such spurious signals can adversely impact fidelity, for example in terms of waveform shape or timing. In an example, the dominant parasitic capacitance sources associated with the first and second switches 301 and 302 can include metal interconnect routing or device junction capacitances that can be related to the physical size of each switch.

Figure 3B:
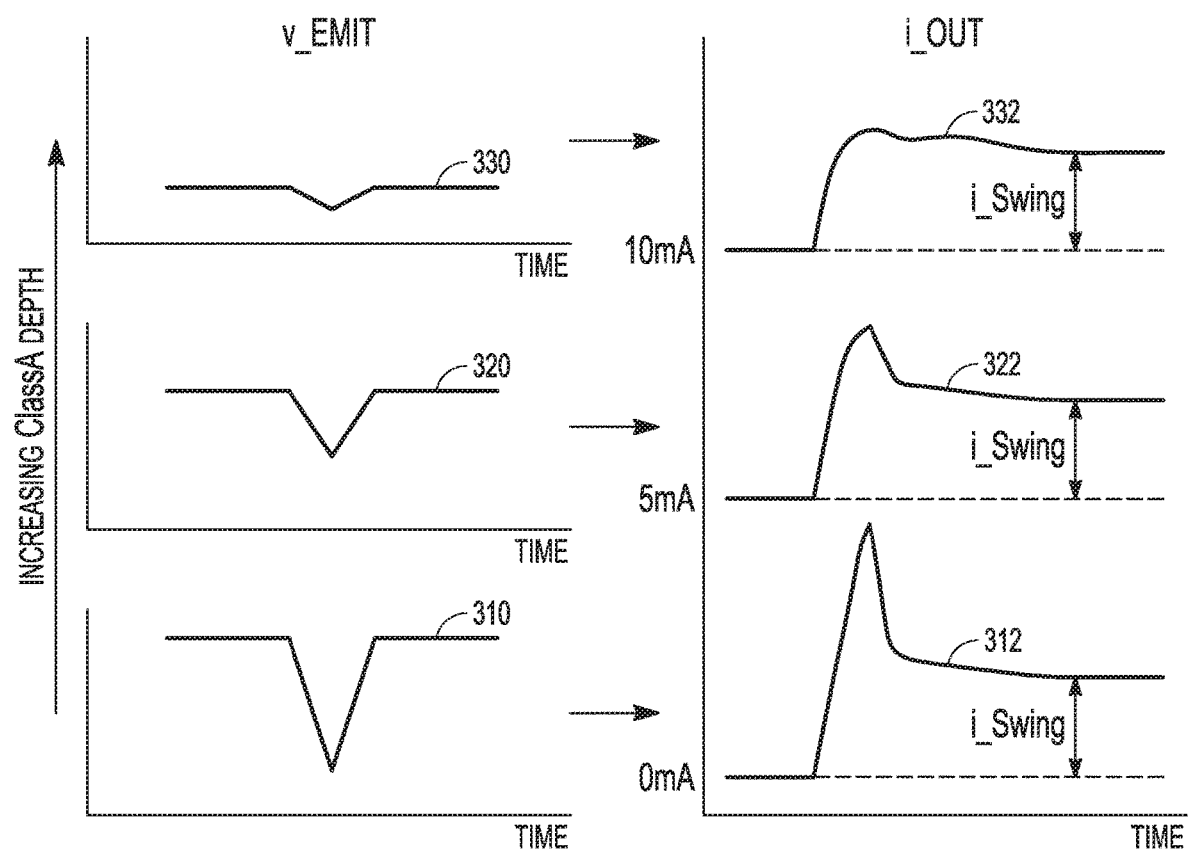
FIG. 3B illustrates generally a series of corresponding voltage and output current waveforms for a test system.

FIG. 3B illustrates generally a series of corresponding voltage and output current waveforms for the example 300 test system of FIG. 3A. For example, FIG. 3B shows at left, a series of different voltage signals at node v_EMIT, and at right, a series of respectively corresponding output current signal i_OUT waveforms. At chart 310, a morphology or shape of the v_EMIT signal is typical of the differential pair from example 300 containing no class A current, as evidenced by the i_OUT starting value of 0 mA in chart 312. The spike or spurious signal transient in chart 312 can be due in large part to the first switch 301 turning completely off, followed by the second switch 302 turning on. The current spike can result from the second switch 302 charging the parasitic capacitances 303 and 304, which can represent high frequency loading on at the v_EMIT node. The current spike can carry through to provide an undesirable voltage spike at the DUT pin 101, for example, causing decreased fidelity and a departure from an ideal pulse waveform shape.

In an example, the i_OUT spike in chart 312, such as produced by a fully switching differential pair, can be substantially independent of an absolute value of i_Swing. That is, even if the entirety of i_Swing is switched during a transition, then the current spike magnitude can be substantially unchanged. A problem that results is that the current spike represents an increasing portion of the overall i_OUT waveform as i_Swing decreases, thereby degrading signal fidelity. The magnitude of the spike is determined primarily by the amplitude of v_EMIT and the parasitic capacitances 303 and 304 present at the v_EMIT node.

In an example, an approach for decreasing the spike amplitude includes reducing the v_EMIT node capacitance or reducing the v_EMIT amplitude. In an example, another approach includes avoiding switching the differential pair fully, and instead switching only a portion of a total available current. The amount of current that is not switched is termed the "class A current" and its ratio to the total current is termed the class A "depth".

Referring again to FIG. 3A, the example 300 includes a current source i_ClassA that represents a class A depth, that is, a portion of the current in the differential pair that is not switched. The i_ClassA current biases the differential pair to an always-on state. The charts 310, 320, and 330 in FIG. 3B illustrate the effect of increasing class A depth on v_EMIT amplitude and correspondingly on the i_OUT current, for example, as i_Swing is kept constant. Charts 310 and 312 represent a 0% depth, as evidenced by the initial i_OUT value of 0 mA. Charts 330 and 332 represent a high class A depth, which in turn yields a relatively high fidelity i_OUT waveform. Charts 320 and 322 represent a moderate class A depth with relatively poor fidelity.

In practice, achieving a high fidelity i_OUT waveform at small i_Swing values, as represented by chart 332, can require substantial class A depth, such as on the order of about 1000%. As a result, information contained in i_Swing coexists with a class A current noise of about ten times i_Swing. That is, any change in i_ClassA is effectively multiplied by ten times from the perspective of i_Swing. In other words, high class A current depth makes it more difficult to produce a known current signal and thus a known i_OUT at the DUT pin 101. In an example, various control loop circuits can be used to attempt to control i_ClassA very precisely. However, such control loop circuits can be large, complicated, and can consume excess power.

Figure 4:
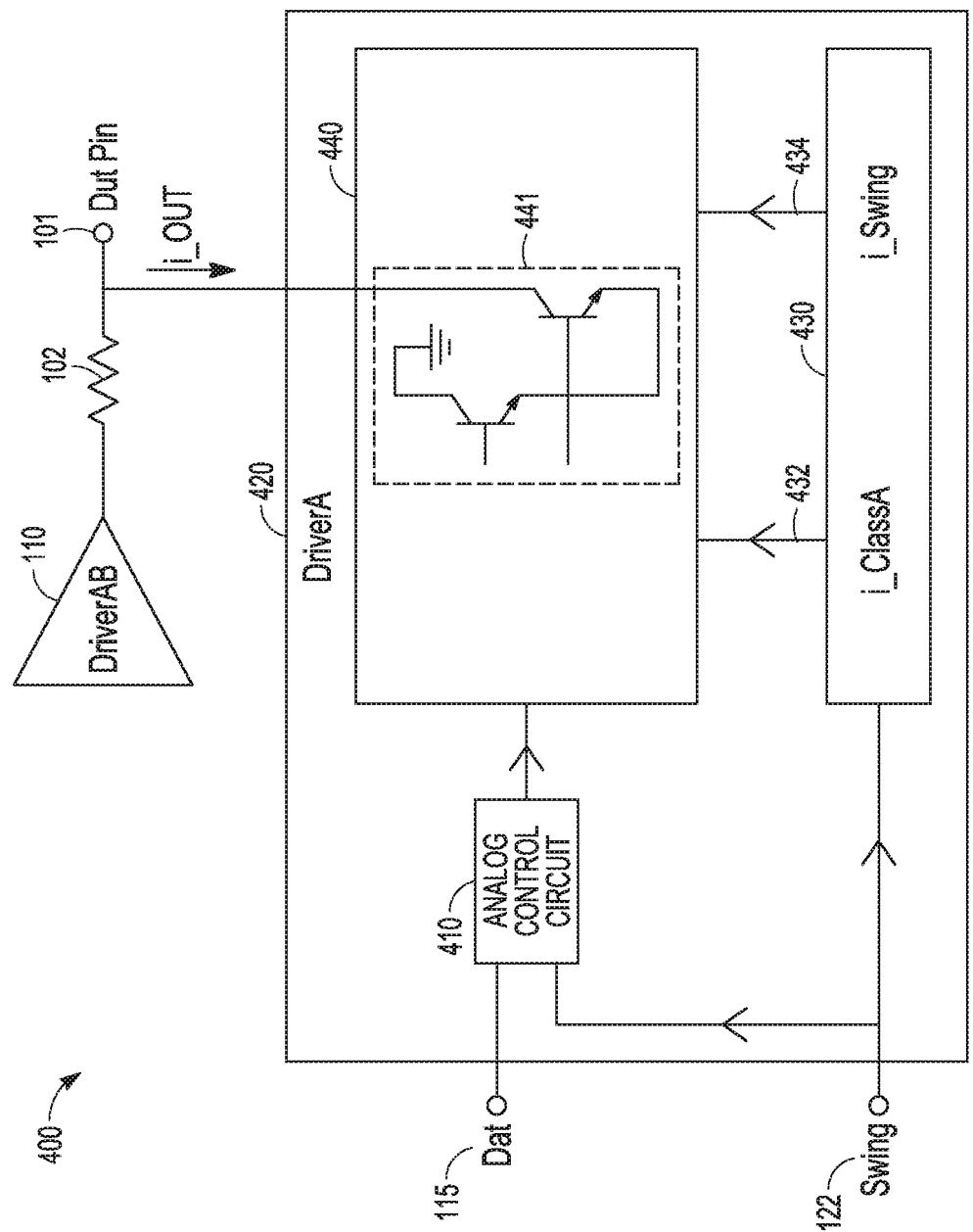
FIG. 4 illustrates generally an example of a block diagram of a class A driver circuit.

FIG. 4 illustrates generally an example of a block diagram 400 of a second class A driver circuit 420. In the example of FIG. 4, the second class A driver circuit 420 can include an analog control circuit 410, a switching circuit 440, and a control loop circuit 430. The second class A driver circuit 420 in FIG. 4 can interface with the class AB driver circuit 110, the output element 102, and the DUT pin 101 as described above.

In an example, the analog control circuit 410 is configured to receive a clock signal via the input node Dat 115, In response to changes in the clock signal, the analog control circuit 410 controls timing for switches in the switching circuit 440.

The second class A driver circuit 420 receives the Swing 122 signal. The Swing 122 signal can include a control voltage signal that indicates a desired i_OUT current, as described above. In an example, the analog control circuit 410 monitors the Swing 122 signal, or control signal, and generates voltage control signals (see, e.g., voltage control signals 307 in FIG. 3A) for the switching circuit 440 based on the Swing 122 signal. The control loop circuit 430 provides various circuits that precisely control class A depth, such as by providing an i_ClassA current 432 and an i_Swing current 434 to the switching circuit 440. In an example, the control loop circuit 430 includes a voltage-tocurrent converter circuit that translates the Swing 122 voltage signal to the i_Swing current 434.

The switching circuit 440 includes a differential pair 441 of switching elements, such as corresponding to the differential pair described above in the example of FIG. 3A. In this example, the differential pair 441 includes large switching devices to accommodate large maximum current switching amplitudes. Correspondingly, each of the two switches in the differential pair 441 contributes a parasitic capacitance that appears at the v_EMIT node (see, e.g., v_EMIT at FIG. 3A) and can degrade output signal fidelity.

In an example, v_EMIT node capacitance can be reduced by using multiple, selectively-enabled switching stages or segments at the switching circuit 440. In this example, the effective size of the switching segments, such as corresponding to the differential pair 441, can be modulated by enabling various ones of the segments, such as based on an expected or selected i_OUT amplitude. In an example, a lookup table can be used to determine which of multiple available segments is to be enabled for a specified i_OUT amplitude, or Swing 122 input signal.

Figure 5:
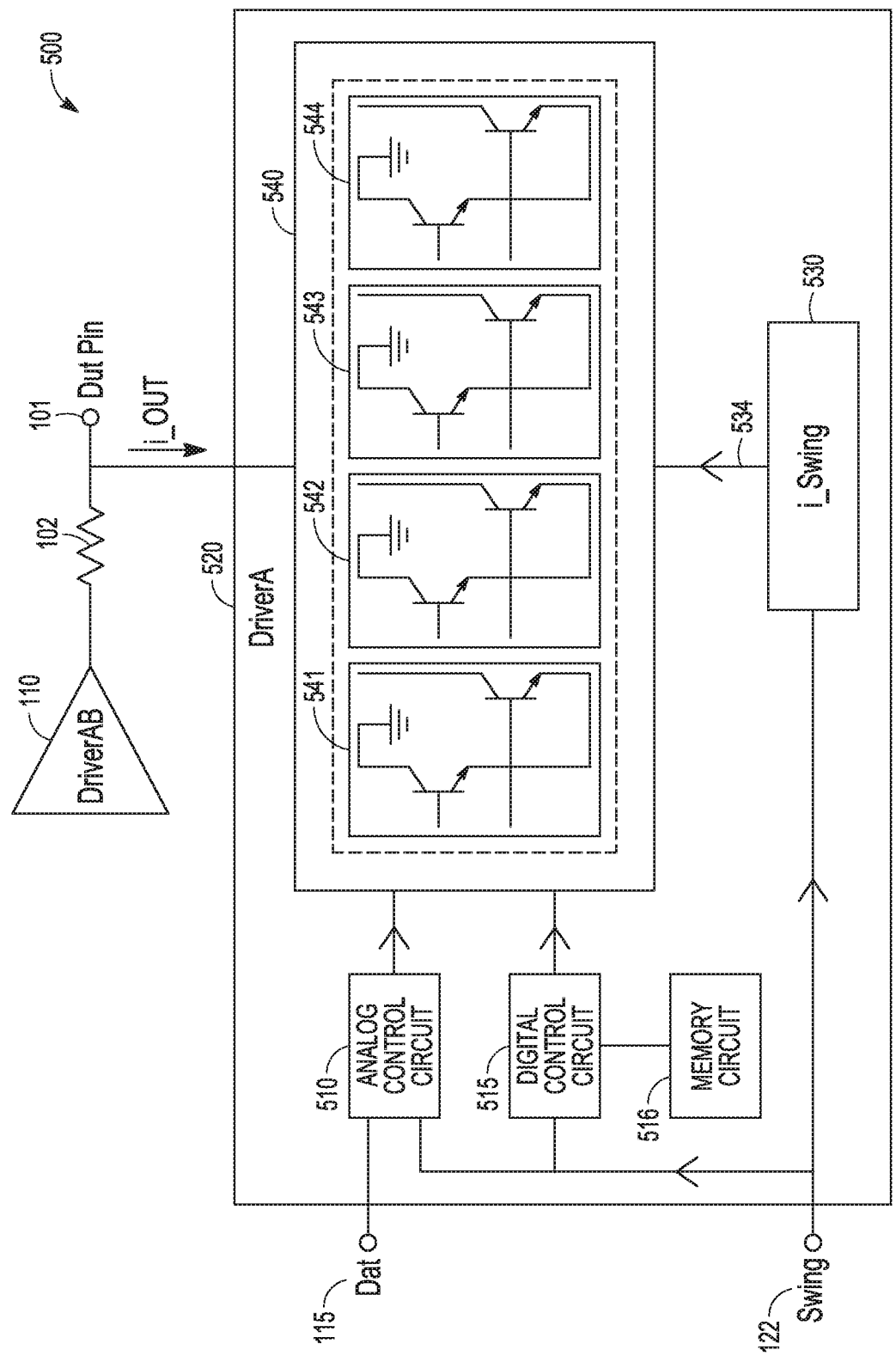
FIG. 5 illustrates generally an example of a block diagram of a class A driver circuit with a segmented switching circuit.

FIG. 5 illustrates generally an example of a block diagram 500 of a third class A driver circuit 520 with a segmented switching circuit 540. In the example of FIG. 5, the third class A driver circuit 520 includes an analog control circuit 510, a digital control circuit 515, a memory circuit 516, the segmented switching circuit 540, and a converter circuit 530. The third class A driver circuit 520 in FIG. 5 interfaces with the class AB driver circuit 110, the output element 102, and the DUT pin 101 as described above to provide test signals to a DUT.

In an example, the analog control circuit 510 receives a clock signal via the input node Dat 115. In response to changes in the clock signal, the analog control circuit 510 controls timing for one or more of the switches in the switching circuit 540. The converter circuit 530 can be configured to receive the Swing 122 voltage input signal and, in response, convert the voltage signal to a current signal i_Swing 534. The i_Swing 534 current signal can be selectively provided at the DUT pin 101 using the segmented switching circuit 540.

The segmented switching circuit 540 includes multiple discrete switching blocks, including a first switching block 541, a second switching block 542, a third switching block 543, and a fourth switching block 544. Fewer or additional switching blocks can be used. Each of the switching blocks includes similar or dissimilar switching elements that can be selectively included in a signal path that sinks or supplies an output current, i_OUT, for example at the DUT pin 101. For example, each of the first through fourth switching blocks 541-544 can include a signal output node that can be selectively coupled to a current-to-voltage converter element, such as the output element 102 at the DUT pin 101.

In an example, a switching block in the segmented switching circuit 540 includes a differential pair of transistors. For example, the first switching block 541 can include a first differential pair, the second switching block 542 can include a second differential pair, and so on. Each of the differential pairs can be similarly or dissimilarly sized or configured. For example, the first differential pair can include a matched pair of transistor devices, and the second differential pair can include a different matched pair of transistor devices. When multiple differential pairs are similarly sized or matched, and multiple ones of the differential pairs are enabled, a current density through each the multiple pairs can be substantially the same. One or more of the pairs can be physically larger or smaller than the others, or can have other distinguishing or unique characteristics. In an example, different transistors in a single switching block can be unmatched or can have different size or configuration characteristics. In an example, the differential pairs include BJT transistors, FET transistors, trench MOS devices, or other switching devices.

Each of the switching blocks in the segmented switching circuit 540 can contribute separately to a loading effect at the driver circuit's output, such as due to parasitic capacitance effects that can be associated with each of the switching blocks individually. However, only switching blocks that are enabled at any given time will contribute to a parasitic capacitance of the segmented switching circuit 540 overall. Thus, if only the first switching block 541 is enabled, then only parasitic effects attributable to the first switching block 541 alone will contribute to a parasitic effect at the test system's output node, such as can cause undesirable transients or spurious output signal components. If multiple blocks are enabled, then parasitic effects from each of the multiple enabled blocks contribute collectively to parasitic effects at the test system's output node. In an example, however, multiple blocks are enabled only to accommodate larger signals, so any parasitic effects can be low relative to the intended swing signal.

In an example, the segmented switching circuit 540 is coupled to a current-to-voltage converter element at an output node of the third class A driver circuit 520. For example, the segmented switching circuit 540 is coupled to the output element 102, such as can be a fixed resistor, which in turn interfaces with the DUT pin 101. That is, each of the first through fourth switching blocks 541-544 includes an output node that is coupled to the output element 102. By coupling the segmented switches, or switching blocks, at an output node of the test system, the third class A driver circuit 520 exhibits improved transition signal fidelity and speed, and exhibits reduced power consumption with respect to other approaches.

The digital control circuit 515 can be configured to monitor the Swing 122 voltage signal and, in response, selectively enable one or more switching blocks in the segmented switching circuit 540. For example, in response to a relatively small Swing 122 voltage signal amplitude, the digital control circuit 515 can selectively enable correspondingly few switching blocks in the segmented switching circuit 540, such as to provide a relatively small output signal i_OUT. In response to a relatively large Swing 122 voltage signal amplitude, the digital control circuit 515 can selectively enable a correspondingly larger number of switching blocks in the segmented switching circuit 540, such as to provide a relatively large output signal i_OUT. That is, when i_OUT is relatively small, then the collective physical size of the switching devices needed to deliver i_OUT is also small, and relatively few switching blocks are therefore enabled to minimize parasitic loading effects. When i_OUT is relatively large, then the collective physical size of the switching devices needed to deliver i_OUT is relatively larger, and multiple switching devices can be enabled to provide a greater effective switching size.

In an example, the digital control circuit 515 includes or is configured to use or receive information from a lookup table to determine which of multiple switching blocks to enable or disable. The lookup table can be stored in the memory circuit 516 or elsewhere. In an example, the lookup table indicates which or how many of the switching blocks are to be enabled or disabled for a given desired output signal magnitude, such as based on a swing signal. In an example, the lookup table includes switching block enable/ disable instructions that correspond to one or more of multiple desired output values, or that correspond to various values of the Swing 122 voltage input. In an example, the lookup table includes switching block instructions that correspond to i_Swing current values, such as can be monitored from the converter circuit 530.

In an example, the digital control circuit 515 monitors a use characteristic of one or more of the switching blocks in the segmented switching circuit 540. Based on the use characteristic, the digital control circuit 515 can be configured to determine whether to enable or disable various switching blocks. A use characteristic can include, among other things, a current or voltage signal that is sensed from a portion of a switching block. For example, the digital control circuit 515 can be configured to monitor a current signal that passes through one or more of the switching blocks and to responsively disable one or more blocks when the current signal amplitude is less than a specified threshold current amplitude level. In an example, the digital control circuit 515 can be configured to monitor a current signal that passes through one or more of the switching blocks and to dynamically enable one or more blocks when the current signal amplitude exceeds some specified threshold current amplitude level.

In an example, the digital control circuit 515 can be configured or tuned by a user. For example, a user can be aware of various signal output requirements and input signal values that a given test system will use. Accordingly, the user can configure the digital control circuit 515 to selectively enable or disable switching blocks for various known input values (e.g., swing signal values). In some examples, a user may wish to enable a greater number of switching blocks to intentionally introduce spurious signals or artifacts to an output test signal i_OUT waveform, such as to determine how a particular DUT will react to anomalous or imperfect stimulus signals.

Multiple advantages can be realized using the segmented switching circuit 540 of FIG. 5. For example, the output signal i_OUT can have better matched rise and fall times, such as relative to the non-segmented example of FIG. 4, because charge times associated with excess capacitances are effectively eliminated. In an example, the rise and fall times can be substantially matched over multiple different Swing 122 voltage input levels. Using better matched rise and fall times, a test system incorporating the segmented switching circuit 540 can more precisely test some memory circuits or VLSI circuits. In an example, propagation delay matching can be improved over non-segmented drivers, such as for multiple Swing 122 voltage input levels. In addition, swing fidelity is improved, as demonstrated in the following figures.

FIGS. 6A-6C illustrate generally charts showing output signals corresponding to a class A driver circuit with a segmented switching circuit. FIGS. 6A-6C correspond to various use configurations of the third class A driver circuit 520 for the same stimulus signal amplitude i_Swing 534. For example, at FIG. 6A, a first chart 610 illustrates a first output current signal 611, such as corresponding to i_OUT in the example of FIG. 5. The first chart 610 corresponds to a configuration in which all of the switching blocks 541-544 are enabled, and i_Swing 534 is small. The resulting first output current signal 611 exhibits overshoot due at least in part to the effects of parasitic capacitance introduced by using more of the switching blocks than is necessary to transmit the relatively small i_Swing 534 signal. In an example, the dominant parasitic capacitance sources can include metal interconnect routing or device junction capacitances that can be related to the total effective physical switch or transistor size in the segmented switching circuit.

At FIG. 6B, a second chart 620 illustrates a second output current signal 621, such as corresponding to i_OUT in the example of FIG. 5, such as in response to the same i_Swing 534 signal amplitude as in the example of FIG. 6A. The second chart 620 corresponds to a configuration in which the first switching block 541 is enabled, and the second through fourth switching blocks 542-544 are disabled. That is, the first switching block 541 includes a conductive path that couples i_Swing 534 to the DUT pin 101, and the other available switching blocks are effectively decoupled from the output node. The resulting second output current signal 621 exhibits less overshoot than the first output current signal 611, for example, because parasitic effects on the output node are minimized when unnecessary switching blocks are removed from the signal path.

FIG. 6C illustrates a third chart 630 showing DUT pin voltage signals for each of the first and second output current signals 611 and 621. That is, the third chart 630 shows expected DUT pin voltage signals that can result in response to receiving the first and second output current signals 611 and 621 at the output element 102, such as with buffering provided by the class AB driver circuit 110. In the example of FIG. 6C, a first DUT pin voltage signal 631 corresponds to the first output current signal 611. The first DUT pin voltage signal 631 includes spurious and non-linear components that can adversely impact test conditions and DUT responses. A second DUT pin voltage signal 632 corresponds to the second output current signal 621, The second DUT pin voltage signal 632 is substantially linear, with a predictable and consistent rise time, and can provide a high fidelity output signal at the DUT pin 101. Thus, by selecting an appropriate number of switching blocks for a given i_Swing input signal, such as using the segmented switching circuit 540, output signal fidelity from a test system can be improved.

Figure 7:
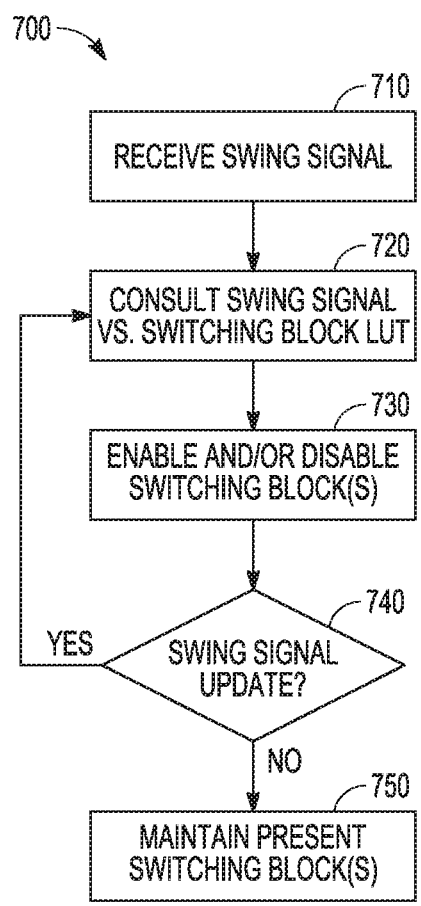
FIG. 7 illustrates generally an example of a method that includes selectively enabling switching segments in a class A driver circuit.

FIG. 7 illustrates generally an example of a method 700 that includes selectively enabling switching segments in a class A driver circuit. In an example, the method 700 corresponds to an operating procedure that can be used with the third class A driver circuit 520 from the example of FIG. 5.

In an example, at operation 710, a test procedure can be initialized and a swing signal can be received, such as at the third class A driver circuit 520 of a test system. The swing signal can indicate a waveform shape, timing, or other characteristic, for a test signal to be generated by the test system. In an example, receiving the swing signal at operation 710 includes receiving a voltage control signal at the digital control circuit 515.

At operation 720, the example can include consulting a lookup table to determine which of multiple available switching blocks in the segmented switching circuit 540 to enable or disable. In an example, operation 720 includes using the digital control circuit 515 to access the lookup table from a local or remote memory circuit. Based on information about the swing signal, such as received at operation 710, the digital control circuit 515 can use the lookup table to identify a digital address of a switching block to enable or disable. For example, in response to information indicating that the swing signal has a relatively large signal amplitude level, the lookup table can provide information to the digital control circuit 515 indicating that all or multiple ones of the available switching blocks should be enabled to produce the desired output signal. In response to information indicating that the swing signal has a small amplitude level, such as less than some threshold amplitude level, the lookup table can provide information to the digital control circuit 515 indicating that only one of the multiple available switching blocks should be enabled to produce the desired output.

In an example, the digital control circuit 515 can be in data communication with a remote circuit or remote device that is configured to provide instructions for enabling or disabling switching blocks. For example, the remote device can be configured to receive swing signal information from the digital control circuit 515 and, in response, to provide an indication to the digital control circuit 515 of one or more switching blocks to enable or disable. The remote device can optionally use a lookup table or other sensed or programmed information to generate the indication of which ones of multiple available switching blocks to enable or disable. The digital control circuit 515 can receive the indication and implement or disregard the configuration provided by the remote device.

At operation 730, the example can include using the digital control circuit 515 to enable and/or disable one or more switching blocks in the segmented switching circuit 540. In an example, enabling a switching block includes inserting a switching device in a signal path between the converter circuit 530 and the DUT pin 101, such as to transmit all or a portion of an i_Swing 534 current signal to an output node. Disabling a switching block can include decoupling at least one node of a switching device from the signal path between the converter circuit 530 and the DUT pin 101. A disabled switching block generally carries no portion of the i_Swing 534 current signal and component(s) of the disabled switching block do not contribute to loading effects at the DUT pin 101, as further described above. Once the appropriate switching blocks are enabled or disabled, that is, once the switching blocks are inserted or removed from the output signal path, then the test system can commence testing.

At operation 740, the example includes determining whether the swing signal, such as received at 710, has changed by more than a specified threshold amount. Small changes in the swing signal can, in some examples, be accommodated by an existing switching block configuration. For example, a present switching block configuration can be maintained, such as at operation 750, when a switching block configuration transmits the i_Swing 534 current signal well within the switching block's linear operating range. A switching block configuration change can be indicated when, for example, fewer or additional switching blocks should be used to maintain or enhance an output signal fidelity, such as in response to a detected threshold change amount in the swing signal, or in response to a detected change in the output signal. When a swing signal or output signal change is identified, such as by the digital control circuit 515 or by another circuit, then the example can return to operation 720 to consult the lookup table and identify an appropriate switching block configuration to implement for further testing.

VARIOUS NOTES & EXAMPLES

Example 1 can include or use subject matter such as an apparatus, device, or machine such as can include or use a transition driving circuit that selectively enables current paths depending on information about a desired voltage transition to increase a fidelity of an output signal transition at an output node of a test system. In Example 1, the transition driving circuit can include a first switch configured to switch a first current path between the output node and a first current source/sink, a second switch configured to switch a second current path between the output node and the first current source/sink, and a control circuit configured to receive information about the desired voltage transition and, depending on a magnitude of the desired voltage transition, to selectively turn on one or both of the first and second switches to enable one or both of the first and second current paths to provide respective portions of the output signal from the first current source/sink to the output node.

Example 2 can include, or can optionally be combined with the subject matter of Example 1, to optionally include the control circuit continuously or intermittently receives the information about the desired voltage transition from an external source and, when the control circuit determines that the information about the desired voltage transition has changed by more than a specified threshold amount, the control circuit updates an on/off status of the first or second switch.

Example 3 can include, or can optionally be combined with the subject matter of Example 2, to optionally include when the information about the desired voltage transition indicates an increase in the desired voltage transition, the control circuit enables both of the first and second switches to enable both of the first and second current paths.

Example 4 can include, or can optionally be combined with the subject matter of Example 2, to optionally include when the information about the desired voltage transition indicates a decrease in the desired voltage transition, the control circuit disables one of the first and second switches to disable one of the first and second current paths.

Example 5 can include, or can optionally be combined with the subject matter of one or any combination of Examples 1 through 4 to optionally include a memory circuit with a lookup table that includes information that correlates desired voltage transitions with on/off states of the first and second switches, wherein the control circuit is configured to use information from the lookup table to determine, based on the received information about the desired voltage transition, which of the first and second switches to enable.

Example 6 can include, or can optionally be combined with the subject matter of one or any combination of Examples 1 through 5 to optionally include an output resistor and a buffer circuit, wherein the output resistor is coupled between the buffer circuit and the output node, and wherein the first current source/sink is configured to source or sink current to the buffer circuit via the first and/or second switches and via the output resistor to provide an output voltage signal at the output node.

Example 7 can include, or can optionally be combined with the subject matter of Example 6, to optionally include the first and second switches comprise portions of a class A driver circuit that is configured to provide test signal waveforms having a first amplitude characteristic, and wherein the buffer circuit comprises a portion of a class AB driver circuit that is configured to separately provide other test signal waveforms having a greater second amplitude characteristic.

Example 8 can include, or can optionally be combined with the subject matter of one or any combination of Examples 1 through 7 to optionally include a first data input configured to receive, as a voltage signal, the information about the desired voltage transition, and a converter circuit configured to convert the voltage signal to a current signal and to distribute the current signal to the enabled ones of the first and second switches.

Example 9 can include, or can optionally be combined with the subject matter of one or any combination of Examples 1 through 8 to optionally include the first and second switches include first and second differential pair circuits, respectively, wherein each of the first and second differential pair circuits includes a leg that is coupled to the output node of the test system.

Example 10 can include, or can optionally be combined with the subject matter of Example 9, to optionally include the first and second differential pair circuits include BJT or FET switch devices.

Example 11 can include, or can optionally be combined with the subject matter of one or any combination of Examples 9 or 10 to optionally include the first and second differential pair circuits are substantially matched in physical size.

Example 12 can include, or can optionally be combined with the subject matter of one or any combination of Examples 1 through 11 to optionally include the control circuit is programmable by a user to define a correspondence between multiple different voltage transition magnitudes and on/off states of the first and second switches.

Example 13 can include or use subject matter such as an apparatus, device, or machine such as can include or use a test system for driving signal transitions at an output node. In Example 13, the test system can include a first driver circuit coupled to the output node, the first driver circuit configured to provide a first signal at the output node, and a first buffer circuit coupled to the output node, the first buffer circuit configured to receive the first signal from the first driver circuit via the output node. In Example 13, the first driver circuit can include a segmented switching circuit including multiple parallel switches configured to collectively provide the first signal from a common current source/sink node to the output node, wherein each of the multiple switches is configured to be independently enabled to provide a respective portion of the first signal to the output node, and wherein a capacitance characteristic of the segmented switching circuit changes according to a number of the switches that are enabled or disabled. The first driver circuit can include a control signal node configured to receive a control signal indicative of a desired magnitude for the first signal, and a control circuit configured to monitor the control signal and to selectively enable one or more of the multiple switches, based on a characteristic of the control signal, to provide the first signal at the output node using the enabled switches, the first signal having the desired magnitude indicated by the control signal.

Example 14 can include, or can optionally be combined with the subject matter of Example 13, to optionally include each of the multiple parallel switches in the segmented switching circuit are coupled to the output node of the test system.

Example 15 can include, or can optionally be combined with the subject matter of Example 14, to optionally include each of the multiple parallel switches includes a differential pair of transistors, and wherein at least one leg of each differential pair of transistors is coupled to the output node of the test system.

Example 16 can include, or can optionally be combined with the subject matter of one or any combination of Examples 13 through 15 to optionally include a memory circuit that stores a lookup table, wherein the lookup table retains a defined relationship between a characteristic of the control signal and enabled ones of the multiple switches, and wherein the control circuit is configured to use information from the lookup table to selectively enable the one or more of the multiple switches.

Example 17 can include, or can optionally be combined with the subject matter of one or any combination of Examples 13 through 16 to optionally include a timing circuit that provides switch timing information to at least the enabled ones of the multiple switches in the segmented switching circuit.

Example 18 can include, or can optionally be combined with the subject matter of one or any combination of Examples 13 through 17 to optionally include the control circuit is configured to enable all of the multiple parallel switches in the segmented switching circuit when the control signal indicates a desired maximum signal transition at the output node, and wherein the control circuit is configured to disable all but one of the multiple parallel switches in the segmented switching circuit when the control signal indicates a desired minimum signal transition at the output node.

Example 19 can include or use subject matter such as an apparatus, device, or machine such as can include or use a control circuit to selectively enable or disable switching blocks in a segmented driver circuit in a pin driver test system. In Example 19, the control circuit can include a data input configured to receive a control signal, the control signal indicative of a desired voltage transition at an output node of the test system, a data lookup table that includes information about relationships between multiple control signal values and multiple switching blocks available for use in the segmented driver circuit, each of the multiple switching blocks configured to enable one of multiple parallel current paths between a common current source/sink and the output node of the test system to provide a test signal, a processor circuit configured to monitor the data input and to generate an enable/disable signal based on detected changes in the control signal, the enable/disable signal indicative of selected ones of the switching blocks to enable or disable based on information from the data lookup table, and a data output configured to provide the enable/disable signal to the switching blocks. The control circuit of Example 19 can optionally be combined with the subject matter of one or any combination of Examples 1 through 18.

Example 20 can include, or can optionally be combined with the subject matter of Example 19, to optionally include the processor circuit is configured to generate an enable signal to enable multiple ones of the switching blocks when the control signal indicates a first desired voltage transition level and wherein the processor circuit is configured to generate a disable signal to disable all but one of the switching blocks when the control signal indicates a lesser second desired voltage transition level.

Each of these non-limiting examples can stand on its own, or can be combined in various permutations or combinations with one or more of the other examples.

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A transition driving circuit that selectively enables one or more current paths depending on information about a desired voltage transition magnitude to change a waveform morphology of an output signal at an output node of a test system when the output signal transitions between high and low voltage amplitudes, the transition driving circuit comprising:
   a class A driver circuit configured to provide first test signal waveforms having a first amplitude characteristic, the class A driver circuit including first and second switches, wherein the first switch is configured to switch a first current path between the output node and a first current source/sink, and wherein the second switch is configured to switch a second current path between the output node and the same first current source/sink;
   a control circuit configured to receive an indication of the desired voltage transition magnitude and in response to the received indication of the desired voltage transition magnitude, vary an open/close status of the first and second switches to change a number of current paths provided between the output node and the first current source/sink during the transition;
   a class AB driver circuit;
   an output resistor coupled between the class AB driver circuit and the output node;
   wherein the first current source/sink is configured to source or sink current to the class AB driver circuit via the first and/or second switches and via the output resistor to provide the output signal at the output node; and
   a memory circuit with a lookup table with information that correlates desired voltage transition magnitudes with enablement of selective ones of the current paths, wherein the control circuit is configured to use information from the lookup table to determine, based on the received information about the desired voltage transition magnitude, which of the first and second switches to open or close.

2. The transition driving circuit of claim 1, wherein the class AB driver circuit is configured to provide other test signal waveforms to the output resistor, the other test signal waveforms having a greater second amplitude characteristic relative to the first amplitude characteristic.

3. The transition driving circuit of claim 1, wherein the second switch is open when the desired voltage transition magnitude is a lesser first transition magnitude from a first voltage level to a greater second voltage level, and the second switch is closed when the desired voltage transition magnitude is a greater second transition magnitude from the first voltage level to a third voltage level, wherein the third voltage level is greater than the second voltage level.

4. The transition driving circuit of claim 1, wherein when the indication of the desired voltage transition magnitude indicates an increase in the desired voltage transition magnitude, the control circuit is configured to close the first and second switches to enable the first and second current paths.

5. The transition driving circuit of claim 1, wherein the control circuit continuously or intermittently receives the information about the desired voltage transition magnitude from an external source and, when the control circuit determines that the information about the desired voltage transition magnitude has changed by more than a specified threshold amount, the control circuit updates an open/close status of at least one of the switches.

6. The transition signal driving circuit of claim 1, wherein the control circuit is programmable by a user to define a correspondence between multiple different voltage transition magnitudes and opened/closed states of the first and second switches.

* * * * *